United States Patent [19]

Shau

[11] Patent Number: 5,748,547
[45] Date of Patent: May 5, 1998

[54] HIGH PERFORMANCE SEMICONDUCTOR MEMORY DEVICES HAVING MULTIPLE DIMENSION BIT LINES

[76] Inventor: Jeng-Jye Shau, 991 Amarillo Ave., Palo Alto, Calif. 94303

[21] Appl. No.: 653,620
[22] Filed: May 24, 1996
[51] Int. Cl.[6] .................................................. G11C 00/00
[52] U.S. Cl. ........................ 365/222; 365/230.03; 365/63
[58] Field of Search ............................... 365/230.03, 222, 365/63, 185.13

[56] References Cited

U.S. PATENT DOCUMENTS

| | | | |
|---|---|---|---|
| 4,106,108 | 8/1978 | Cislaghi et al. | 365/222 |
| 4,758,993 | 7/1988 | Takemae et al. | 365/189 |
| 4,833,653 | 5/1989 | Mashiko et al. | 365/189 |
| 4,887,240 | 12/1989 | Garverick et al. | 361/222 |
| 4,914,630 | 4/1990 | Fujishima et al. | 365/222 |
| 4,920,517 | 4/1990 | Yamauchi et al. | 365/207 |
| 4,984,208 | 1/1991 | Sawada et al. | 365/222 |
| 5,226,147 | 7/1993 | Fujishima et al. | 395/423 |
| 5,251,177 | 10/1993 | Akamatsu et al. | 365/222 |
| 5,253,211 | 10/1993 | Suzuki | 365/222 |
| 5,276,843 | 1/1994 | Tillinghast et al. | 395/425 |
| 5,291,444 | 3/1994 | Scott et al. | 365/189 |
| 5,305,280 | 4/1994 | Hayano | 365/230 |
| 5,321,662 | 6/1994 | Ogawa | 365/222 |
| 5,365,487 | 11/1994 | Patel et al. | 365/226 |
| 5,421,000 | 5/1995 | Fortino et al. | 395/425 |
| 5,499,215 | 3/1996 | Hatta | 365/63 |
| 5,561,626 | 10/1996 | Fujii | 365/23.03 |

OTHER PUBLICATIONS

"A Full Bit Prefetch Architecture for Synchronous DRAM's", by Toshio Sunaga etc. IEEE J. of Solid-st. Circuits. vol. 30. No. 9. p. 998, Sep. 1995.

Primary Examiner—Tan T. Nguyen

[57] ABSTRACT

The long-existing tight pitch layout problems for dynamic random access memory devices have been solved by using a multiple-dimension bit line structure. A novel memory access procedure provides the capability to make internal memory refresh completely invisible to external users. By use of such memory architecture, higher performance DRAM can be realized without degrading memory density. The requirements for system support are also simplified significantly.

21 Claims, 12 Drawing Sheets

FIG. 2 (prior art multi-bank memory)
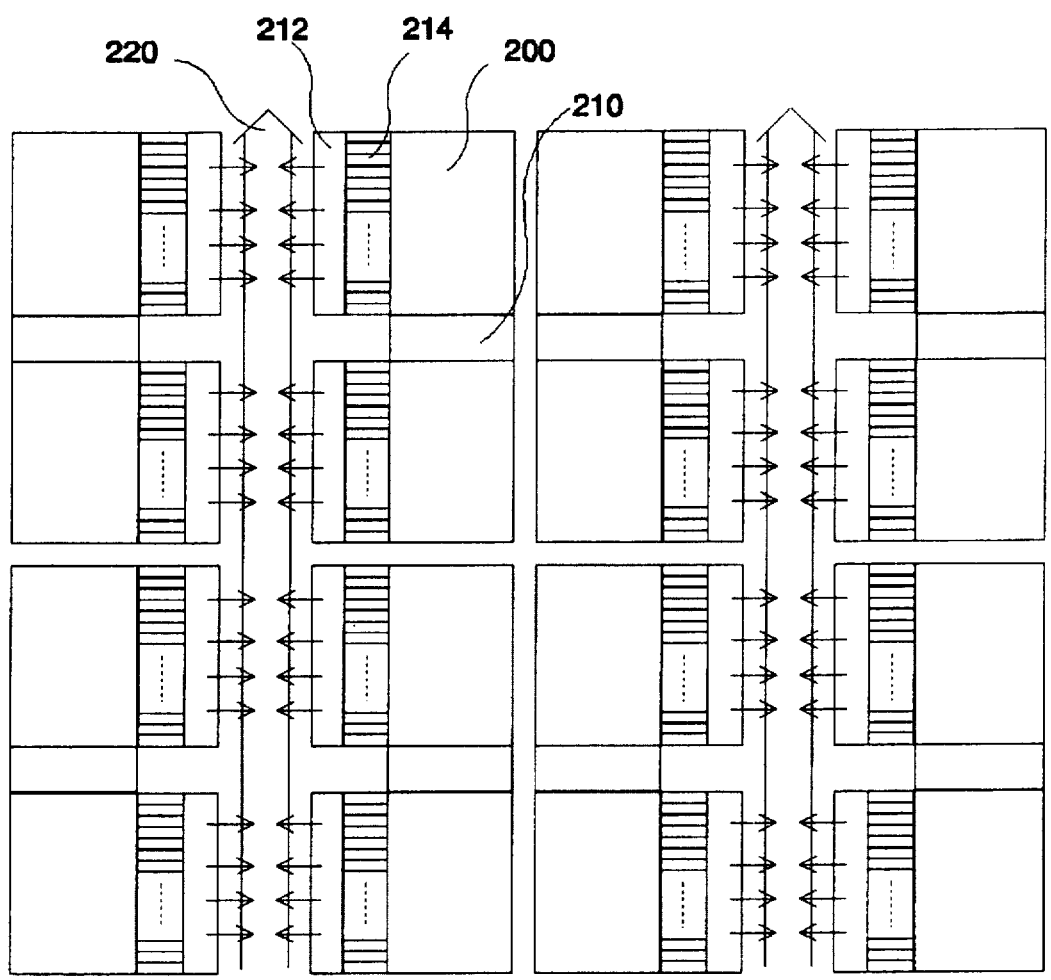

FIG. 7a (read cycle)
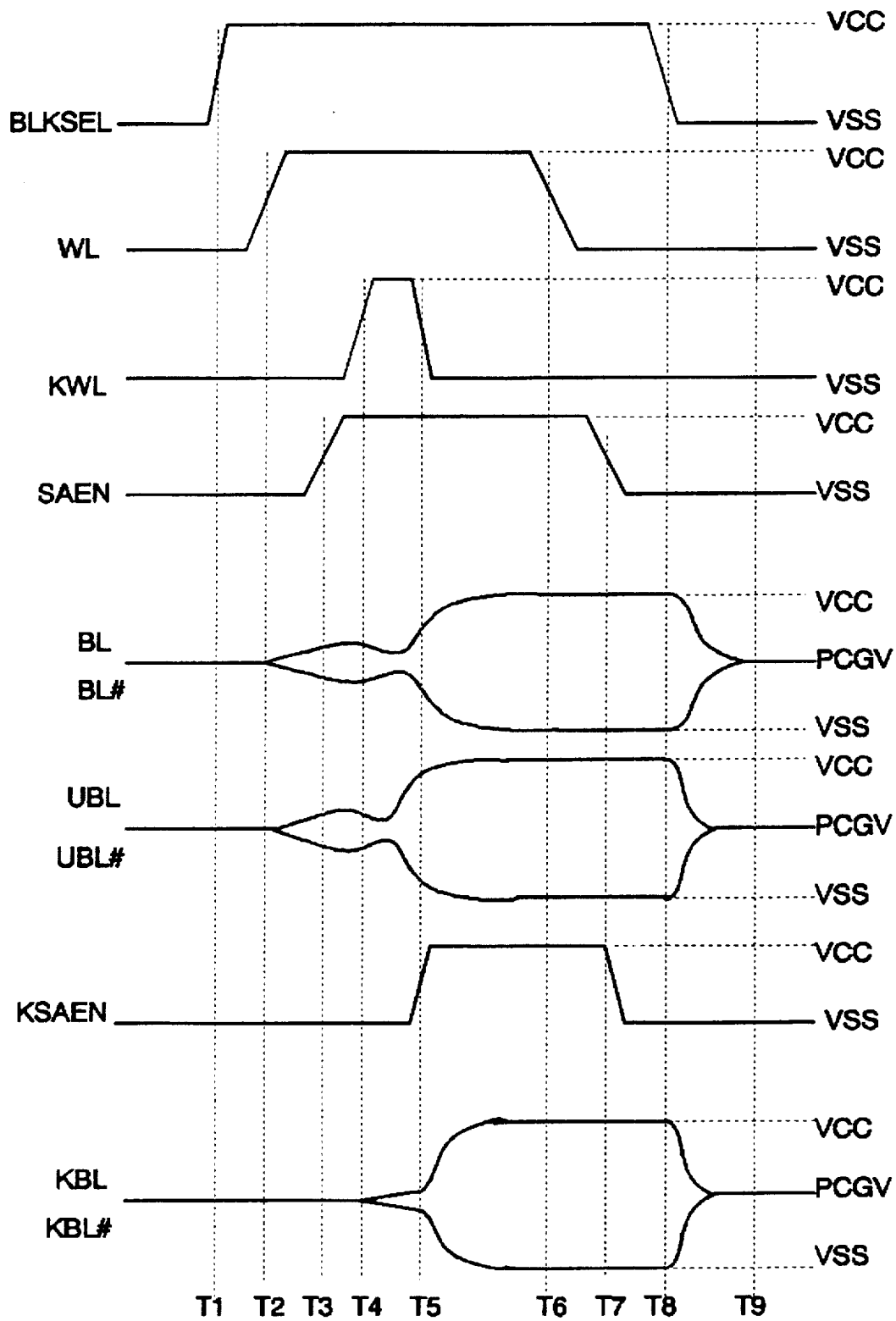

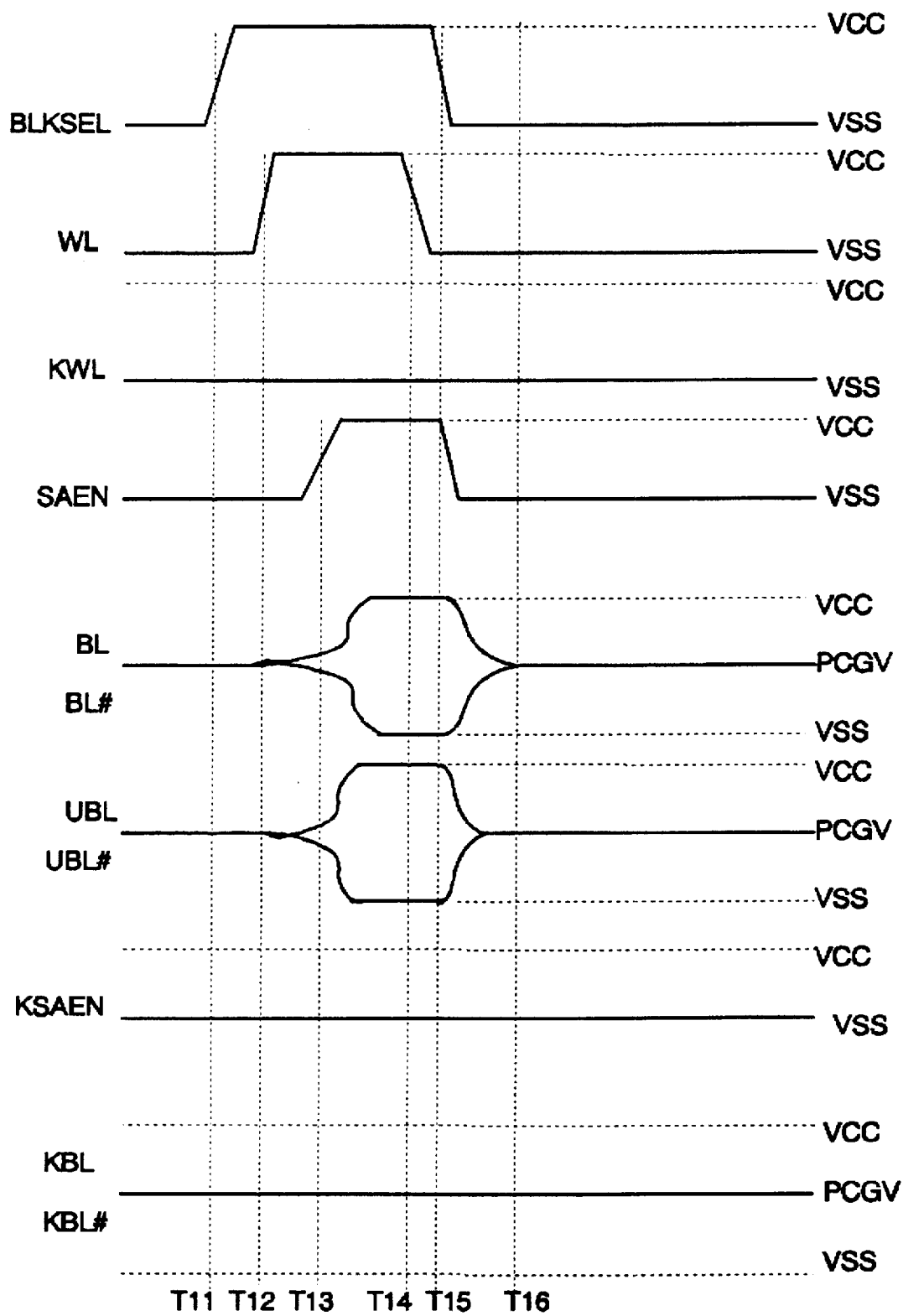
FIG. 7b (refresh cycle)

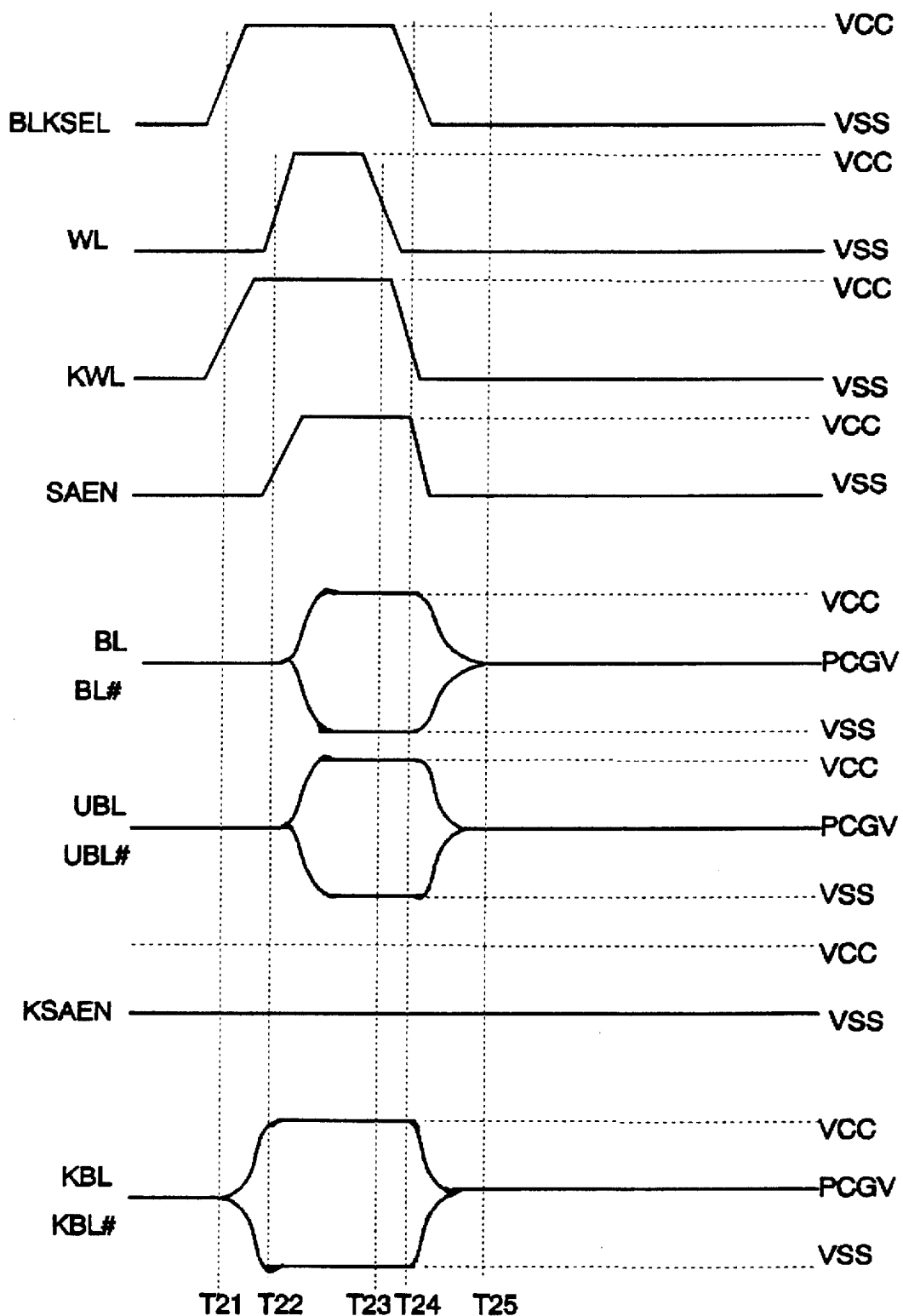
FIG. 7c (update cycle)

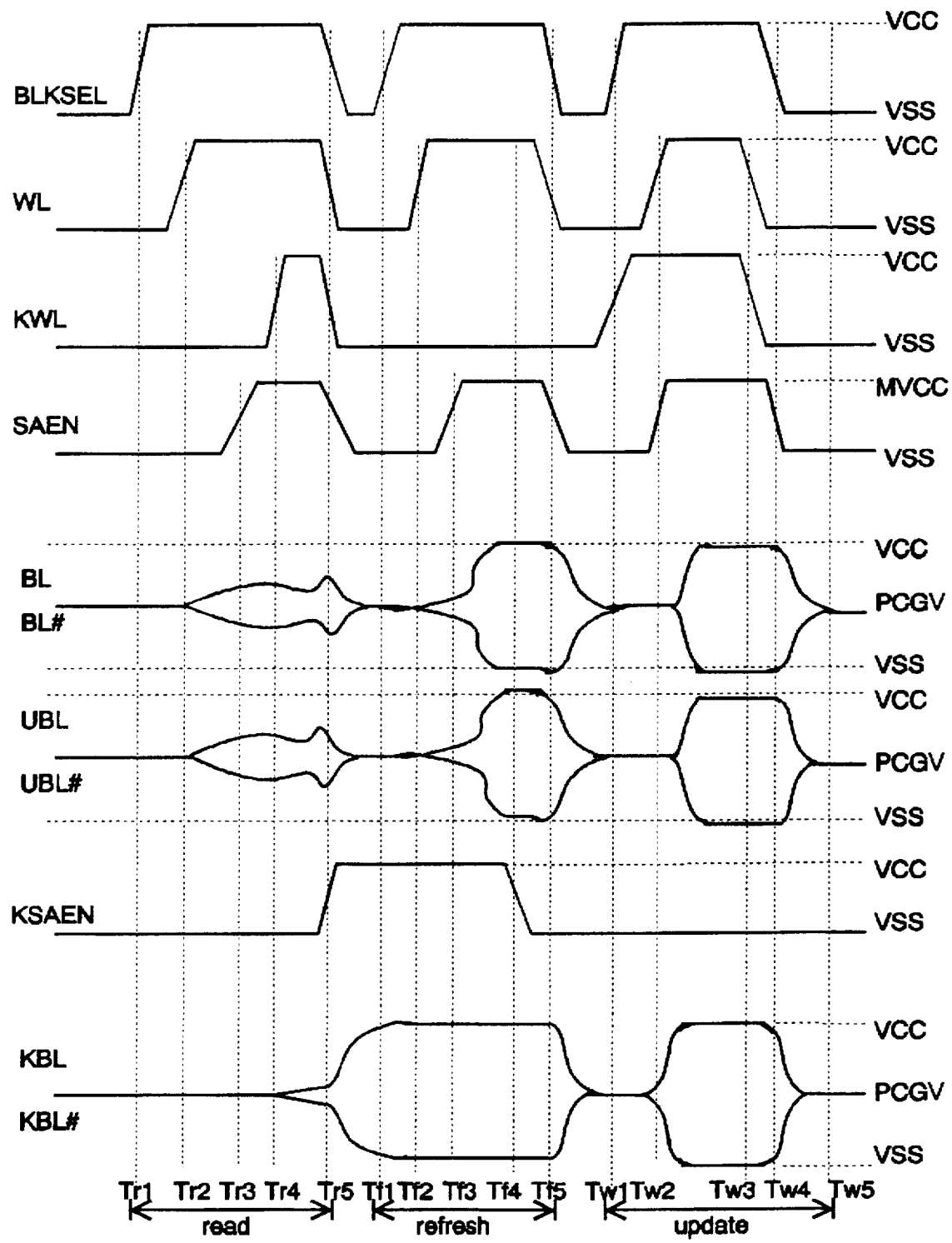

HIGH PERFORMANCE SEMICONDUCTOR MEMORY DEVICES HAVING MULTIPLE DIMENSION BIT LINES

BACKGROUND OF THE INVENTION

The present invention relates to high performance semiconductor memory devices, and more particularly to memory devices having bit lines disposed along different layout directions.

DRAM is usually considered as a high density, low cost, but low performance memory device. DRAM's of current art always have lower performance relative to other types of semiconductor memories such as static random access memory (SRAM). The density of DRAM has been improved rapidly; the extent of integration has been more than doubled for every generation. Such higher integration of DRAM has been realized mainly by super fine processing technique and improvements in memory cell structure. In the mean time, the improvement in DRAM performance is progressing at a much slower rate. This relatively slower improvement rate in performance generates a performance gap between logic devices and memory devices. Many new approaches have been proposed to reduce this performance gap. The synchronized DRAM (SDRAM), the extended data output (EDO) DRAM, the multiple bank DRAM (MDRAM), and the RAMBUS system approaches are the most well known methods to improve DRAM performance. U.S. Pat. No. 4,833,653 issued to Mashiko et al. and U.S. Pat. No. 4,758,993 issued to Takemae et al. disclosed DRAM having selectively activated subarrays in order to improve performance. Another approach to improve DRAM performance is to place an SRAM cache into DRAM (called "hybrid memory"). U.S. Pat. No. 5,421,000 issued to Fortino et al., U.S. Pat. No. 5,226,147 issued to Fujishima et al., U.S. Pat. No. 5,305,280 issued to Hayano et al. disclosed embodiments of hybrid memories. The major problem for above approaches is that they are paying very high price for performance improvement, while the resulting memory performance improvement is still not enough to fill the gap. Another problem is that all of those approaches require special system design that is not compatible with existing computer systems; it is therefore more difficult to use them in existing computer systems.

Another disadvantage of DRAM is the need to refresh its memory. That is, the users need to read the content of memory cells and write the data back every now and then. The system support for DRAM is more complex than SRAM because of this memory refresh requirement. Memory refresh also represents a waste in power. U.S. Pat. No. 5,276,843 issued to Tillinghast et al. disclose a method to reduce the frequency of refresh cycles. U.S. Pat. No. 5,305,280 issued to Hayano et al. and U.S. Pat. No. 5,365,487 issued to Patel et al. disclosed DRAM's with self-refresh capability. Those inventions partially reduce power consumption by refresh operations, but the magnitude of power saving is very far from what we can achieve by the present invention. The resource conflict problem between refresh and normal memory operations also remains unsolved by those patents.

Recently, Integrated Device Technology (IDT) announced that the company can make DRAM close to SRAM performance by cutting DRAM into small sub-arrays. The new device is not compatible with existing memory; it requires special system supports to handle conflicts between memory read operation and memories refresh operation. It requires 30% more area the DRAM, and its performance is still worse than SRAM of the same size.

Another important problem for DRAM design is the tight pitch layout problem of its peripheral circuits. In the course of the rapid improvement in reducing the size of memory cells, there has been no substantial improvement or change as to peripheral circuits. Peripheral circuits such as sense amplifiers, decoders, and precharge circuits are depend upon memory cell pitch. When the memory cells are smaller for every new generation of technology, it is more and more difficult to "squeeze" peripheral circuits into small pitch of memory layout. This problem has been magnified when the memory array is cut into smaller sub-arrays to improve performance. Each subarray requires its own peripheral circuits; the area occupied by peripheral circuits increases significantly. Therefore, in the foreseeable future, there may occur a case wherein the extent of integration of DRAM is defined by peripheral circuits. U.S. Pat. No. 4,920,517 issued to Yamauchi et al. disclosed a method to double the layout pitch by placing sense amplifiers to both ends of the memory. This method requires additional sense amplifiers. Although the available layout pitch is wider than conventional DRAM, the layout pitch is still very small using Yamauchi's approach.

All of the above inventions and developments provided partial solutions to memory design problems, but they also introduced new problems. It is therefore highly desirable to provide solutions that can improve memory performance without significant degradation in other properties such as area and user-friendly system support.

SUMMARY OF THE INVENTION

The primary objective of this invention is, therefore, to improve the performance of semiconductor memory device without paying extensive area penalty. Another primary objective is to make DRAM more user-friendly by making the performance improvement in parallel with simplification in system supports. Another primary objective is to provide an improved semiconductor memory device in which peripheral circuits can readily follow further higher integration of memory cells. Another objective is to reduce power consumption of high performance semiconductor memory.

These and other objects are accomplished by a semiconductor memory device according to the invention, which includes a novel architecture in connecting bit lines along multiple layout directions and a novel timing control that can finish a read cycle without waiting for completion of memory refresh.

According to the present invention as described herein, the following benefits, among others, are obtained.

(1) The multiple dimensional bit line structure dramatically reduces the parasitic loading of bit lines seen by each sense amplifier. Therefore, we can achieve significant performance improvement. Our results show that a memory of the present invention is faster than an SRAM of the same memory capacity.

(2) The multiple dimension bit line structure also allows us to use one sense amplifier to support many bit line pairs. Therefore, we no longer have tight pitch layout problem for sense amplifiers and other peripheral circuits. Removing tight pitch layout problem allows us to achieve performance improvement without paying high price in layout area.

(3) A novel input and output (IO) circuit design allows us to delay the memory refresh procedures until next memory operation. This approach allows us to "hide" refresh cycles and memory update cycles in a normal memory operation. The resulting memory device is as friendly as existing SRAM device. In fact, a memory of this invention can be made fully compatible with existing SRAM device.

(4) All of the above improvements are achieved by using much lower power than the power used by prior art DRAM's.

While the novel features of the invention are set forth with particularly in the appended claims, the invention, both as to organization and content, will be better understood and appreciated, along with other objects and features thereof, from the following detailed description taken in conjunction with the drawing.

BRIEF DESCRIPTION OF THE DRAWINGS

FIG. 2 is a simplified block diagram of a multiple bank semiconductor memory device;

FIG. 7a shows the waveforms of critical signals during a read cycle;

FIG. 7b shows the waveforms of critical signals during a refresh cycle;

FIG. 7c shows the waveforms of critical signals during a write cycle;

FIG. 9 shows the timing relationship of critical signals of a memory device of this invention.

DETAILED DESCRIPTION OF THE INVENTION

Before the invention itself is explained, a prior art semiconductor memory device is first explained to facilitate the understanding of the invention.

Figure 1:
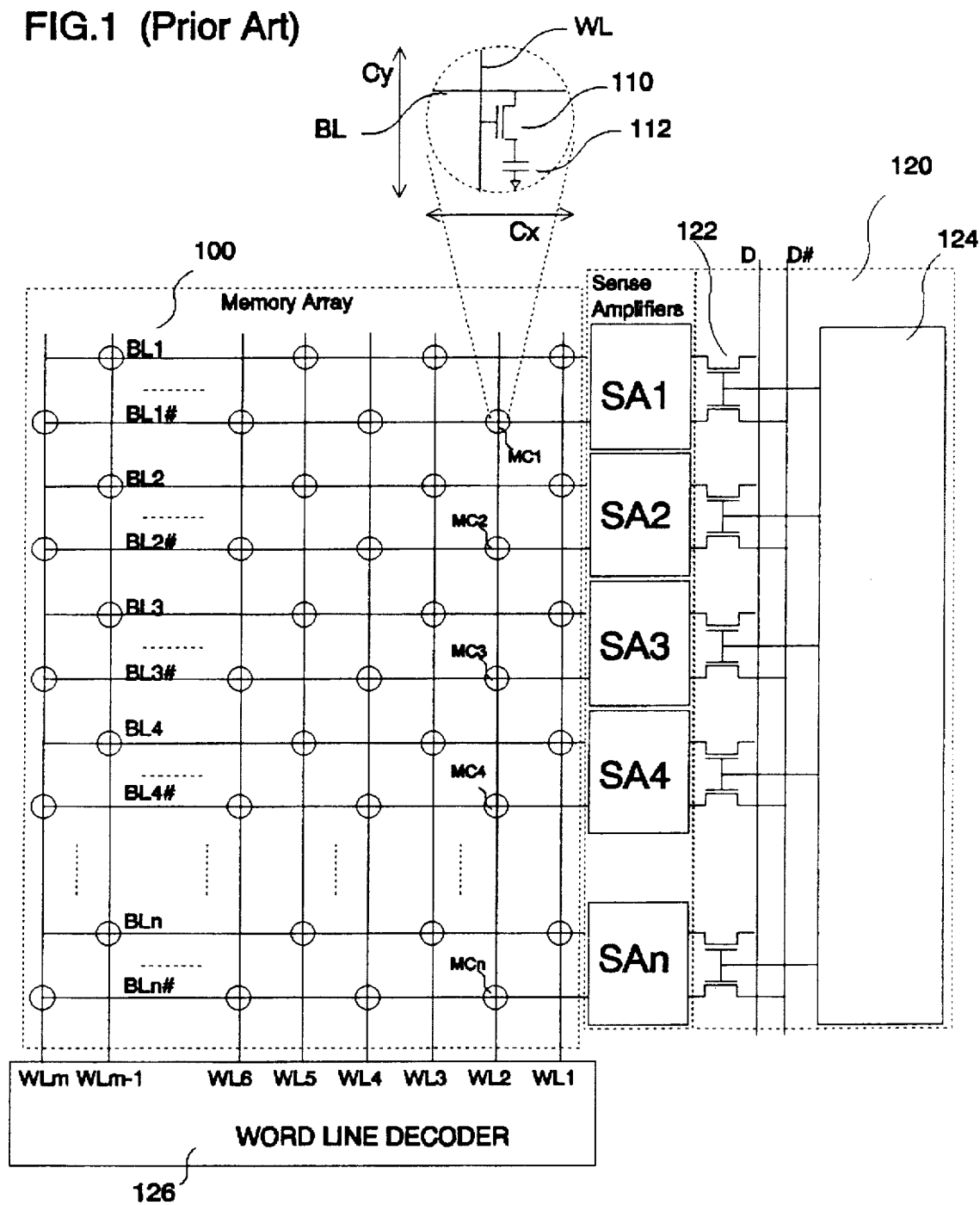
FIG. 1 is a schematic block diagram of a prior art memory device.

FIG. 1 shows memory cell array structure of a prior art DRAM in both electrical and topographical manners. Memory cell array 100 includes plural pairs of bit lines BL1, BL1#; BL2, BL2#, BL3, BL3#; ...; BLn, BLn# (n;integer) which are disposed in parallel manner and a plurality of word lines WL1, WL2 ... WLm (m;integer) which are disposed in parallel manner and also in such manner that they intersect with bit lines perpendicularly. At intersecting points, memory cells MC1, MC2, ..., MCn are disposed. Memory cells are shown by circle marks in memory cell array 100 in FIG. 1. Each memory cell is formed by switching field effect transistor 110 and memory cell capacitor 112. Bit line BL is connected to the drain of the transistor 110. The gate of transistor 110 is connected to word line WL. Sense amplifiers SA1, SA2, ... SAn are disposed at one end of memory cell array and each pair of bit lines are connected to one sense amplifier. For example, a pair of bit lines BL1, BL1# are connected to sense amplifier SA1, a pair of bit lines BL2, BL2# are connected to sense amplifier SA2, ... , and a pair of bit lines BLn, BLn# are connected to sense amplifier SAn. The outputs of those sense amplifiers are connected to data output switches 120. The output switches 120 contain a multiplexer 122 that is controlled by a decoder 124. The output switches 120 select the outputs from one of the sense amplifiers, and place the data on the data buses D and D#.

For example, when information is read out from memory cell MC1, following operations are carried out. First, word line WL2 is selected by the word line decoder 126 and the transistor 110 in memory cell MC1 is rendered conductive. Thereby, signal charge in capacitor 112 of memory cell MC1 is read out to bit line BL1# so that minute difference of electric potential occurs between a pair of bit lines BL1 and BL1#. Such difference is amplified by sense amplifier SA1. The output switches 120 select the outputs of SA1 and thereafter, transfer the data to data buses D, D# through a multiplexer 122. After the above read procedure, the charge stored in the cell capacitor 112 is neutralized. It is therefore necessary to write the original data sensed by SA1 back to the memory cell MC1. Such procedure is called "refresh". The sense amplifier used in current art has the capability to refresh the memory cell after it determines the state of the memory cell. It is very important to remember that all the other memory cells along the word line, MC2, MC3, ... MCn, are also rendered conductive when WL2 is selected. It is therefore necessary to turn on all the other sense amplifiers SA2, SA3, ... SAn to read and to refresh the data stored in all other memory cells connected to WL2, when we only need the data stored in MC1.

DRAM of such structure has following drawbacks.

(1) In order to read the data from a few memory cells along one word line, we need to read all the memory cells along that word line in order to refresh the content of those activated memory cells. Most of the energy is used for refreshing instead of reading data. This waste in energy also results in slower speed because a large number of devices need to be activated.

(2) As the size of the memory array increases, the bit line parasitic capacitance (Cb) increases. The ratio between the memory cell capacitance Cm and the bit line parasitic capacitance Cb determines the amplitude of the potential difference on the bit line pairs. The memory read operation is not reliable if the (Cm/Cb) ratio is too small. Thereby, the (Cm/Cb) ratio is often the limiting factor to determine the maximum size of a memory array. Special manufacturing technologies, such as the trench technology or the 4-layer poly technology, have been developed to improve the memory cell capacitance Cm. However, the Cm/Cb ratio remains a major memory design problem.

(3) To support refresh procedures, we always need to have one sense amplifier for each bit line pair. As higher integration of memory cells progresses, the layout pitch for sense amplifier decreases. Thereby, it becomes difficult to form stable and well operable sense amplifier within the pitch. Such problem is often referred as the "tight pitch layout" problem in the art of integrated circuit design. Tight pitch layout always results in excessive waste in silicon area due to the difficulty in squeezing active devices into a narrow space. Similar problem applies to other peripheral circuits such as decoders and pre-charge circuits.

To reduce the effect of the above problems, large memory of prior art is always divided into plural sub-arrays called memory banks 200 as shown in FIG. 2. Each bank 200 of the memory sub-array has its own decoder 210 and output switches 212. Each pair of the bit lines in each memory bank needs to have one sense amplifier 214. The outputs of each memory bank are selected by output switches 212, and placed on data buses 220 so that higher order amplifiers and decoders can bring the data to output pins.

This multi-bank approach provides partial solutions to the problems. Because each memory bank can be operated independently, power consumption can be reduced by keeping unused memory banks in low power state. The speed is also improved due to smaller active area. The (Cm/Cb) ratio can be kept at proper value by limiting the size of each memory bank. Multiple-bank memory allows us to turn on a sub-set of sense amplifiers to save power, but each bit line pair still needs to have one sense amplifier because we still need to refresh the contents of all activated memory cells. This multi-bank approach provides partial solutions, but it creates new problems. Each memory bank needs to have a full set of peripheral circuits; the areas occupied by peripheral circuits increase significantly. Smaller size of memory bank implies higher percentage of area spent on peripheral circuits. Balancing the requirement between (Cm/Cb) ratio and the increase in tight pitch layout peripheral circuits is a major design problem for multiple bank memories. Yamauchi et al. were able to double the pitch for sense amplifiers by placing sense amplifiers at both sides of the memory array, but the layout pitch is still too small. Many other approaches have been proposed, but all of them provided partial solutions to part of the problems while created new problems.

Figure 3A:
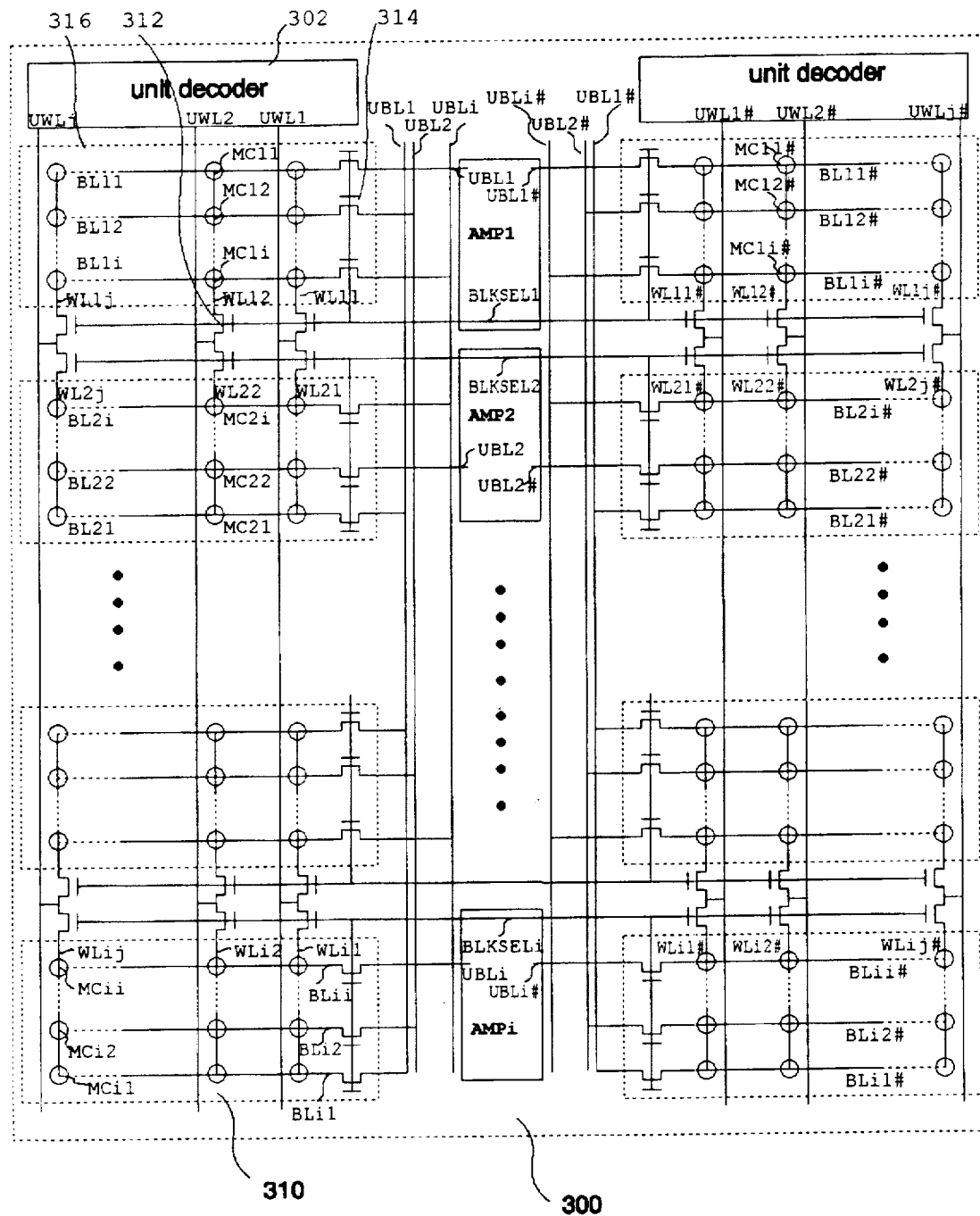
FIG. 3a is a schematic block diagram of a memory device with two-dimensional bit lines.

This invention is made to solve the above-stated problems. FIG. 3a shows memory structure of one embodiment of the present invention in both electrical and topographical manners. The building block of the present invention is a memory unit 300. Each memory unit contains decoders 302, amplifiers AMP1, AMP2, . . . , AMPi, and a plurality of memory blocks 310. These memory blocks are arranged in pairs; memory block 1# is symmetrical to memory block 1; memory block 2# is symmetrical to memory block 2; . . .; and memory block i# is symmetrical to memory block i. Each memory block contains word line switches 312, bit line switches 314, and a small memory array 316. The word line switches 312 and bit line switches 314 are controlled by block select signals. For example, the block select signal BLKSEL1 controls the word line switches and the bit line switches in memory block 1 and in memory block 1#. The memory array contains memory cells similar to the memory cells in FIG. 1. Circle marks are used to represent those memory cells in FIG. 3a. Each memory cell is connected to a short word line and a short bit line within each memory block. For example, in memory block 1 the gate of the memory cell MC12 is connected to block word line WL12 and block bit line BL12. Each block word line is connected to one unit word line through a word line switch 312. For example, WL12 is connected to UWL2 through a word line switch 312 controlled by block select signal BLKSEL1; WL22 is connected to UWL2 through a word line switch controlled by block select signal BLKSEL2; . . . ; WLij is connected to UWLj through a word line switch controlled by block select BLKSELi (i and j are integers). In this example, the memory unit has two levels of bit lines—the unit level bit lines UBL1, UBL1#, UBL2, UBL2# . . . UBLn, UBLn# and the block level bit lines BL11, BL11#, BL12, BL12#, . . . et al. The block bit lines are made by the first layer metal (metal 1), and they are disposed vertical to the word lines. The unit bit lines are made by the second layer metal (metal 2), and they are disposed in parallel to the word lines. Each block bit line is connected to one unit bit line through one bit line switch 314 in each block. For example, BL12 is connected to UBL2 through a bit line switch controlled by block select signal BLKSEL1; BL22 is connected to UBL2 through a bit line switch also controlled by block select signal BLKSEL2; . . . ; BLii is connected to UBLi through a bit line switch controlled by block select BLKSELi. Each pair of unit bit lines is connected to one amplifier. For example, UBL1 and UBL1# are connected to AMP 1; UBL2 and UBL2# are connected to AMP2; . . . ; UBLi and UBLi# are connected to AMPi. Those unit bit lines and block bit lines form a two-dimensional network that allow one amplifier to support many bit line pairs in different memory blocks.

This two-dimensional bit line connection allows us to read the memory content with little waste in power. For example, when information is read out from memory cells on WL12 in block 1, following operations are carried out. First, the block select signal BLKSEL1 is activated, while all other block select signals remain inactive. All the word line switches 312 and bit line switches 314 in memory block 1 and in memory block 1# are rendered conductive, while those of all other memory blocks remain inactive. The unit decoder 302 activates the unit word line UWL2 while keeping other unit word lines inactive. Therefore, only WL12 is activated while all other block word lines remain inactive. The transistor 110 in memory cell MC12 is rendered conductive. Thereby, signal charge in capacitor of memory cell MC12 is read out to block bit line BL12 and to unit bit line UBL2 through the block bit line switch 314. In the mean time, BL12# is also connected to UBL2# through the block bit line switch in memory block 1#, but there is no signal charge read out to UBL2# because WL12# remains inactive. Since the bit lines in the memory block pairs are drawn in mirror symmetry, their parasitic capacitance is matched. The signal charge in memory cell MC12 develops a minute difference of electric potential between UBL2 and UBL2#. Such difference is detected and is amplified by sense amplifier AMP2; the result is sent to high order data bus (not shown), and is used to refresh memory cell MC12. Similarly, the content of memory cell MC11 is read and refreshed by sense amplifier AMP1; the content of memory cell MCi1 is read and refreshed by sense amplifier AMPi.

If we want to read the data from memory cells on WL12# in block 1#, the procedure is identical except that the unit decoder 302 should activate UWL2# instead of UWL2. If we want to read from memory cells in WLij in block i, the unit decoder 302 should turn on UWLj and the block select signal BLKSELi should be activated. The content of memory cell MCi1 is read and refreshed by sense amplifier AMP1; the content of memory cell MCi2 is read and refreshed by sense amplifier AMP2; . . . ; and the content of memory cell MCii is read and refreshed by sense amplifier AMPi.

It is still true that one sense amplifier is activated for each activated memory cell; otherwise the data stored in the memory cell will be lost. The differences provided by this invention are (1) the activated sense amplifiers no long need to be placed right next to the local bit lines connected to the activated memory cell, (2) each sense amplifier can support plural bit line pairs in different memory blocks, and (3) the number of activated memory cells is only a small fraction of that of a prior art DRAM. This multiple dimensional bit line structure allows us to place the activated sense amplifier far away from the activated memory cells without introducing excessive parasitic loading to the bit lines. The layout pitches of sense amplifier and peripheral circuits are independent of the size of memory cell. It is therefore possible to design high performance peripheral circuits without increasing the area significantly.

It is to be understood that the present invention describes multiple dimension bit line structure "before" the storage charges in activated memory cells are detected by the first level sense amplifiers. Prior art multi-bank DRAM often has multiple dimension data buses "after" the first level sense amplifier already detected the storage charge in activated memory cells. The prior art multi-bank memories need one first level sense amplifier for every bit line pairs, and they do not solve the tight pitch layout problem.

While specific embodiments of the invention have been illustrated and described herein, it is realized that other modification and changes will occur to those skilled in the art. For example, the above embodiment assumes that bit line pairs are rendered in opposite memory block pairs. It should be obvious to those skilled in the art that this invention also can support the conventional bit line pairing structure in FIG. 1 where bit line pairs are arranged right next to each other. It is also obvious that the above two dimensional bit line structure can be easily expanded to three-dimensional or multi-dimensional bit line structures. A two dimensional bit line structure is described in FIG. 3a for its simplicity, but the number of levels of bit line structures is not limited by the above example. The optimum levels of bit line structures are determined by details of manufacture technology and by the design specifications. It also should be obvious that the bit line switches are not required elements; the unit bit lines can be connected directly to block bit lines without bit lines switches. Bit line switches help to reduce the bit line capacitance seen by each sense amplifier, but they are not required for functional reason because the word line switches already can isolate the memory cells in each memory block from memory cells in other memory blocks. While one sense amplifier is placed in each pair of memory block in the above example, there is no such constraint in this invention; we can place more than one sense amplifier per memory block, or place one sense amplifier in the area of many memory blocks; due to the multiple dimension bit line structure, the present invention completely removes the layout constraint between memory array and peripheral circuits.

Figure 3B:
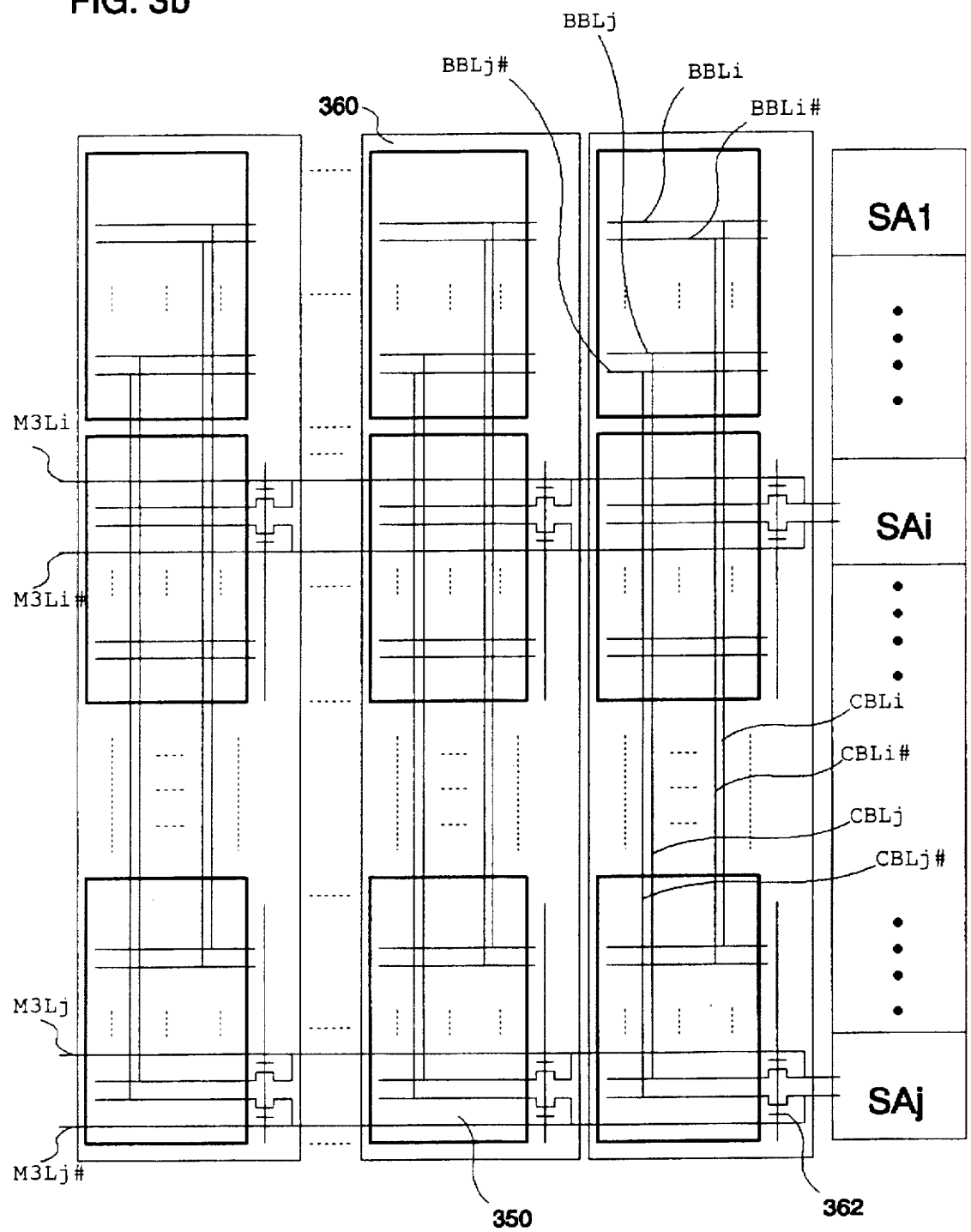
FIG. 3b is a schematic block diagram of a memory device with three-dimensional bit lines.

FIG. 3b shows a memory array of the present invention with 3-level bit line connections. For simplicity, only two pairs of bit lines are shown in this figure. The first level of bit lines are made by the first layer metal (M1), the second level is made by the second layer metal (M2), and the third level is made by the third layer metal (M3). Each memory block 350 contains a plurality of side-by-side M1 bit line pairs (BBLi, BBLi#), (BBLj, BBLj#). This memory array contains a plurality of memory columns 360. The M1 bit lines are connected to corresponding M1 bit lines in other memory blocks along the same memory column 360 by M2 bit lines CBLi, CBLi#, CBLj, CBLj#. The bit lines in each column are connected to the bit lines in other columns using metal 3 bit lines M3Li, M3Li#, M3Lj, M3Lj# through bit line switches 362. For each bit line in one memory column 360, we only need one bit line switch 362 and one M3 bit line. A group of sense amplifiers SA1, . . . , Sai, . . . SAj, are placed at one end of the memory array. Each pair of the above three-dimension bit line networks are connected to one sense amplifier. For example, the (BBLi, CBLi, M3Li), (BBLi#, CBLi#, M3Li#) pair are connected to SAi, and the (BBLi, CBLi, M3Li), (BBLi#, CBLi#, M3Li#) pair are connected to SAj. Since each memory block 350 has its own word line switch (not shown in FIG. 3b), no more than one memory block in the network can be activated at any time. It is therefore possible to support a large number of memory cells using a small number of sense amplifiers without violating the requirement that every activated memory cell must have an activated sense amplifier to detect its storage charge.

Figure 4A:
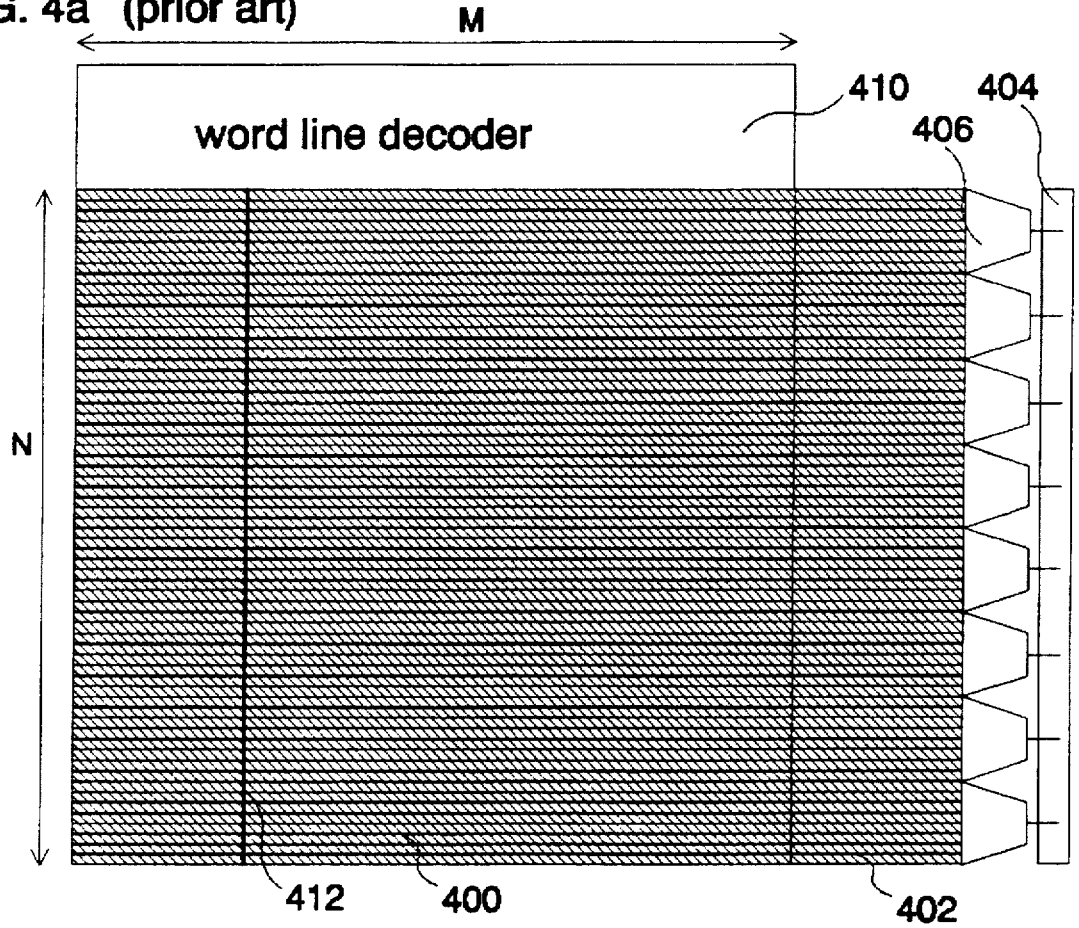
FIG. 4a is an illustration showing layout and power consumption of a prior art memory bank.

Although the bit line structure in FIG. 3b is the actual bit line structure used in our product, for simplicity, we will use the simpler two-dimensional bit line structure in FIG. 3a as example in the following discussions. The difference in layout area and the difference in power consumption between the prior art and this invention are illustrated by the simplified block diagrams in FIGS. 4(a,b). FIG. 4a shows a simplified symbolic graph of one memory bank of conventional DRAM memory array 400 that has N bit line pairs, M word lines, and 8 output (N and M are integers). The sense amplifiers are represented by long rectangles 402 in FIG. 4a. Because each bit line pair is supported by one sense amplifier, the layout pitch for the sense amplifier is the layout pitch of a bit line pair, so that they must be placed in long narrow rectangular area. The outputs of the sense amplifiers are selected into 8 outputs by the output decoder 404 and multiplexers 406. The layout pitch for the output decoder 404 is also very narrow. The layout pitch for each element of the word line decoder 410 is the pitch of one memory cell Cx. For a memory operation, one word line 412 is activated across the whole memory bank. The number of active memory transistors is N. All N sense amplifiers are activated, and all N bit line pairs in this memory bank are charged or discharged by the sense amplifiers. The activated area covers the whole memory bank as illustrated by the shaded area in FIG. 4a.

Figure 4B:
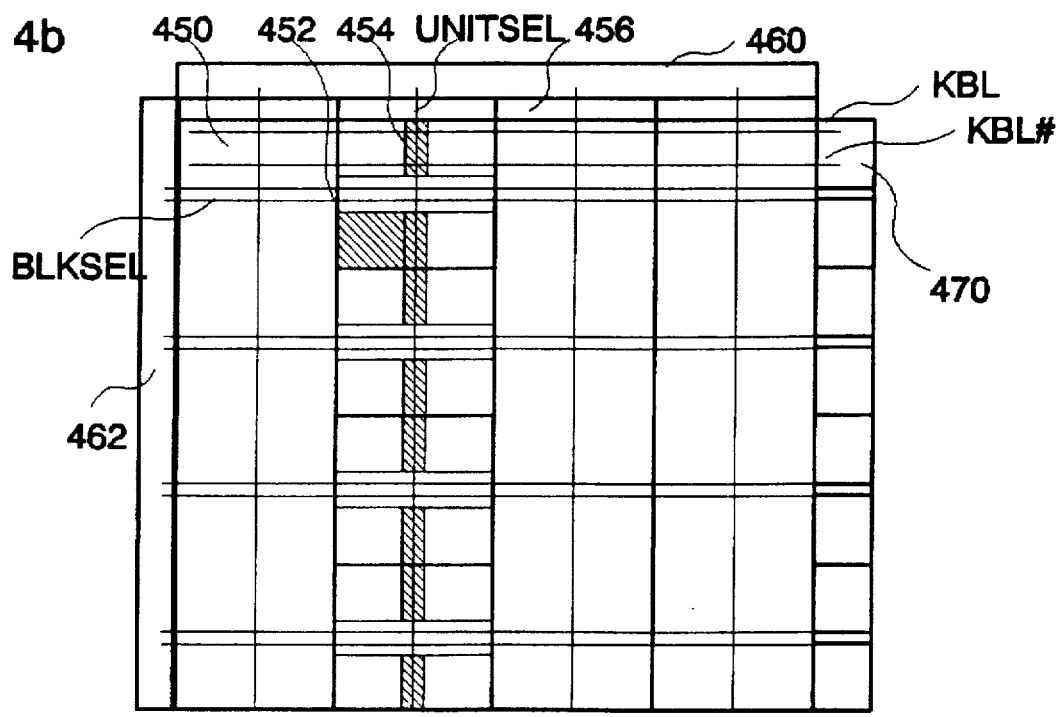
FIG. 4b is an illustration showing layout and power consumption of a semiconductor memory device of a first embodiment according to the invention.

FIG. 4b is a simplified symbolic graph of one bank of DRAM memory array of the present invention. For simplicity in comparison, we assume that the memory array in FIG. 4b contains the same number of memory cells and the same number of data outputs as the memory array in FIG. 4a. The memory bank is divided into 4 units 450, and each unit contains 8 pairs of memory blocks 452. We have one amplifier 454 for each pairs of memory blocks. Each unit has one unit word line decoder 456. Detailed structure of the memory unit has been described in FIG. 3a. A unit select decoder 460 generates unit select signals UNITSEL along word line directions. A block select decoder 462 generates bank level block select signals BLKSEL. A memory block 452 is activated when both UNITSEL and BLKSEL crossing the block are activated. The outputs of each amplifier is placed on bank level bit lines KBL, KBL# to input/out (IO) units 470 at the edge of the memory. For simplicity, only one pair of bank level bit lines are shown in FIG. 4b. Further details of those peripheral circuits will be discussed in following sections. FIG. 4b shows that the layout pitch for the sense amplifiers 454 is 8 times wider than that in FIG. 4a. The peripheral circuits no longer require tight pitch layout, so that we can design them efficiently for both speed and area consideration. For a memory operation, only one memory block 452 and 8 sense amplifiers 454 in the selected unit 450 are activated. The activated area is illustrated by the shaded area in FIG. 4b. This active area is obviously much smaller than the active area of a conventional memory bank shown in FIG. 4a. Power consumption of the present invention is therefore much less than that of a prior art memory.

According to FIGS. 3a, a memory array unit 300 is disclosed. The memory array unit 300 includes 2M single-bit memory cells organized into 2N blocks, where M is a multiplication-product of N by I by J, and N, I and J are positive integers. The memory array unit 300 are operated with N cell-refreshing sense amplifiers AMP1, AMP2, . . . , AMPL. The memory array unit 300 includes N pairs of dual-symmetrical blocks where each of the blocks includes {J(j)×I} single-bit memory cells, and where j=1, 2, 3, ..., N, and the positive integer I representing a bit length of a stored data. Each of the blocks includes a J(j)-by-I two dimensional array and wherein every I single memory cells being connected with a first level bit line, i.e., bit line BLni in block n for bit-i, along a first bit-line direction and every J(j) single-memory cells are connected by a first level word line, i.e., WLj for word-j, wherein each the first level word lines and the first level bit lines intersect at one of the single-bit memory cells, i.e., memory cell MCnij a memory cell in block n along bit line n intersecting with word line-j. Each of the I first level bit lines in each of the blocks being connected to a corresponding multiple-block first level bit-lines, i.e., multiple-block bit-line-i UBLi, where i=1, 2, 3, . . . I, wherein the multiple-block first-level bit lines UBLi being arranged in a second bit-line direction, e.g., a vertical direction, different from the first-bit line BLni direction, e.g., a horizontal direction, and each being connected to the corresponding first level sense-amplifier-I AMPi, where i=1, 2, 3, . . . I; and. A block select signal means for activating a block select signal, i.e., a BLKSEL signal, to activate one of the J(j) first level word lines in one of the blocks, i.e., block-n where n is a positive integer ranging from 1 to N, and wherein the I cell-refreshing sense amplifiers, i.e., AMP1, AMP2, . . . AMPI, being activated for detecting memory-cell signals from each of the first level I bit lines of the block n and a corresponding symmetrical block of the block-n, i.e., block-n and block-n# where n=1, 2, 3, . . . n, for reading data therefrom whereby the N blocks sharing the I cell-refreshing sense amplifiers.

Furthermore, according to FIG. 3a, a method is disclosed to provides an entirely new architecture and configuration for organizing 2M single-bit memory cells into 2N blocks, where M is a multiplication-product of N by I by J, and N, I and J are positive integers. The method comprising steps of: (a) dividing the 2M single-bit memory cells into N pairs with each pair includes two symmetrical blocks where each of the block includes {J(j)×I} single-bit memory cells, and where j=1, 2, 3, . . . , N, and the positive integer I representing a bit length of a stored data; (b) arranging the single-bit memory cells in each of the blocks into a J(j)-by-I two dimensional array and by connecting every I single memory cells with a first level bit line in a first bit-line direction and every J(j) single-memory cells by a first level word line wherein each the first level word lines and the first level bit lines intersect at one of the single-bit memory cells; (c) connecting each of the I first level bit lines in each of the blocks to a corresponding multiple-block first level bit-lines, i.e., multiple-block bit-line-i where i=1, 2, 3, . . . I, wherein the multiple-block first-level bit lines being arranged in a second bit-line direction different from the first-bit line direction and each being connected to a corresponding cell-refreshing sense-amplifier-i where i=1, 2, 3, . . . I; and; (d) applying a block select signal to activate one of the J(j) first level word lines in one of the blocks, i.e., block-n where n is a positive integer ranging from 1 to N, and employing the I cell-refreshing sense amplifiers for detecting memory-cell signals from each of the first level I bit lines of the block n and a corresponding symmetrical block of the block-n, for reading data therefrom whereby the N blocks sharing the I cell-refreshing sense amplifiers.

Furthermore, according to FIGS. 3a to 4b, a semiconductor memory device 300 is disclosed which is provided for operation with a plurality of cell-refreshing sense-amplifiers (SAs). The memory device 300 includes a memory cell array having a plurality of first-direction first-level bit lines, e.g., bit line BLni in block n for bit-i, along a first bit-line direction, disposed in a parallel manner along a first direction, e.g., a horizontal direction. The memory cell array further includes a plurality of word lines WL intersected with the first-direction first-level bit lines. The memory cell array further includes a plurality of memory cells wherein each of the plurality of memory cells being coupled between one of the first-direction first level bit lines, i.e., bit line BLni in block n for bit-i, along a first bit-line direction and one of the word lines for storing data therein. The memory device further includes a plurality of different-direction first level bit lines, e.g., multiple-block or the unit bit-line-i such as UBLi, BBLi, CBLi, etc. (referring to FIG. 3b), where i=1, 2, 3, . . . I, disposed along a plurality of different directions, e.g., along a vertical direction, with at least one of the different directions being different from the first direction, wherein each of the first direction first level bit lines connected to one of the cell-refreshing sense amplifiers (SAs) directly or via the different-direction first level bit-lines. In a specific preferred embodiment, one of the different directions, e.g., a vertical direction, for arranging the different-direction first level bit lines, e.g., the multiple-block bit-line-i UBLi, BBLi, CBLi, etc. (referring to FIG. 3b), where i=1, 2, 3, . . . I, being perpendicular to the first direction, e.g., a horizontal direction for arranging the first-direction first level bit lines. In the preferred embodiment as shown in FIG. 4b, the memory device 300 further includes bit line switches connected between the first level bit lines which are arranged in different directions.

According to FIGS. 3a to 4b, a method for configuring a semiconductor memory device for operation with a plurality of cell-refreshing sense-amplifiers (SAs) is also disclosed. The method includes the steps of (a) arranging a plurality of first-direction first-level bit lines in a parallel manner along a first direction; (b) arranging a plurality of word lines for intersecting with the first-direction first-level bit lines; (c) coupling a memory cell between each of the first-direction first level bit lines and one of the word lines for storing data therein; (d) arranging a plurality of different-direction first level bit lines along a plurality of different directions with at least one of the different directions being different from the first direction; and (e) connecting each of the first direction first level bit lines to one of the cell-refreshing sense amplifiers (SAs) directly or via the different-direction first level bit-lines. In a specific embodiment, the method further includes a step of (f) configuring one of the different directions for arranging the different-direction first level bit lines to be perpendicular to the first direction for arranging the first-direction first level bit lines. In another preferred embodiment, the method further includes a step of (g) interconnecting bit line switches between the first level bit lines of different directions and the different-direction first level bit lines for selectively switching and activating the bit lines.

The parasitic bit line parasitic capacitance Cbp of the prior art memory in FIG. 4a is $$Cbp=(M/2)*Cd+M*Cm1 \quad (1)$$

where Cd is the diffusion capacitance for one bit line contact, Cm1 is the metal 1 capacitance of the bit line for each unit cell, and M is the number of memory cells along one bit line. We assume that each contact is shared by two memory cells so that the total number of contacts is M/2.

The parasitic bit line capacitance Cb of the memory in FIG. 4b is $$Cb=(M/16)*Cd+(M/8)*Cm1+(8*Cd+N*Cm2) \quad (2)$$

where Cm2 is the metal 2 bit line capacitance for each memory pitch along the unit bit line direction. The first two terms (M/16)*Cd+(M/8)*Cm1 are the capacitance for a local bit line that is ⅛ of the length of the bit line in FIG. 4a. The last two terms (8*Cd+N*Cm2) are the parasitic capacitance of the unit bit line that has 8 contacts to the bit line switches and a metal 2 bit line. The contact capacitance Cd is much larger than the metal capacitance. The metal 2 capacitance Cm2 is usually smaller than the metal 1 capacitance Cm1. Therefore, Eqs. (1,2) show that the bit line parasitic capacitance seen by one sense amplifier of the present invention, Cb, is significantly smaller than Cbp. Smaller bit line capacitance implies faster speed, lower power, and better reliability. There is no need to use complex technology to build the memory cells. It is also possible to increase the size of each memory block to connect more memory cells to each sense amplifier in order to reduce the total area.

The total areas occupied by memory cells are identical between the two memory arrays in FIG. 4a and FIG. 4b. Therefore, the difference in area is completely determined by the layout of peripheral circuits. The available layout pitch for sense amplifiers and for output decoders for the memory in FIG. 4b is 8 times larger than that of the memory in FIG. 4a. It should be obvious to those skilled in the art that a memory of the present invention is smaller than a prior art memory along the dimension vertical to the word line direction due to wider layout pitch. Along the dimension in parallel to word lines, the present invention still needs a decoder 460 of the same layout pitch. In addition, this invention needs to have one set of word line switches 462 for each memory block 452. The additional area occupied by the word line switches 462 does not increase the layout area significantly because we can use smaller high level decoders due to reduction in loading.

Figure 5:
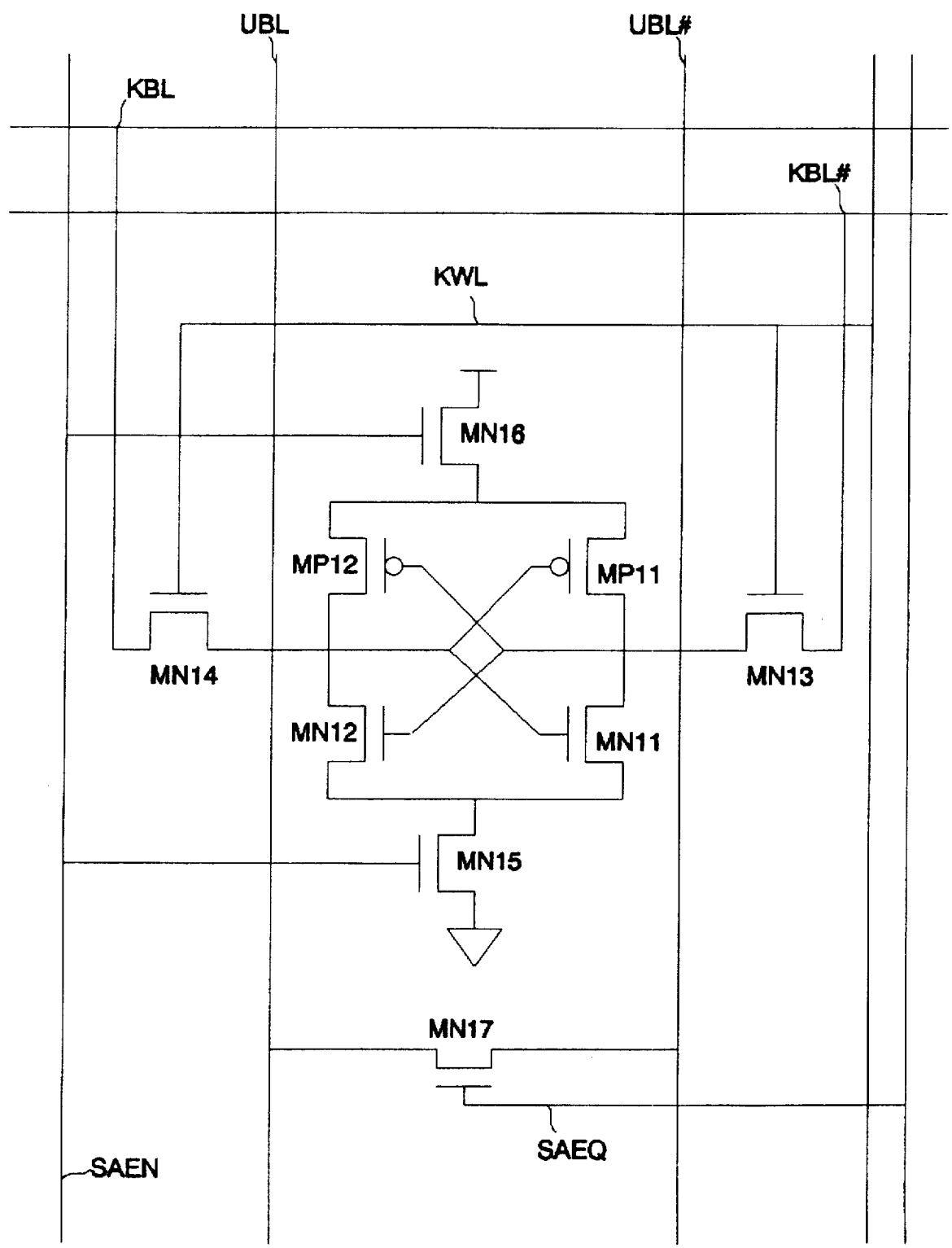
FIG. 5 is a schematic diagram of the sense amplifier used by this invention.

The sense amplifier used in the present invention is substantially the same as typical sense amplifiers used in the prior art. FIG. 5 shows schematic diagram of the amplifier in FIG. 3a. When the sense amplifier enable signal SAEN is activated, transistors MP11, MP12, MN11, and MN12 form a small signal sensing circuit that can detect minute potential difference on the unit bit line pairs UBL and UBL#. The transfer gate transistor MN14 transfers the signal between the unit level bit line UBL and the bank level bit line KBL when the bank level word line KWL is active. The transfer gate transistor MN13 transfers the signal between the unit level bit line UBL# and the bank level bit line KBL# when the bank level word line KWL is active. MN17 is used to equalize the voltages on UBL and UBL# when the sense amplifier is not active. The operation principles of the above sense amplifiers are well-known to the art of memory design so we do not describe them in further details.

Figure 6:
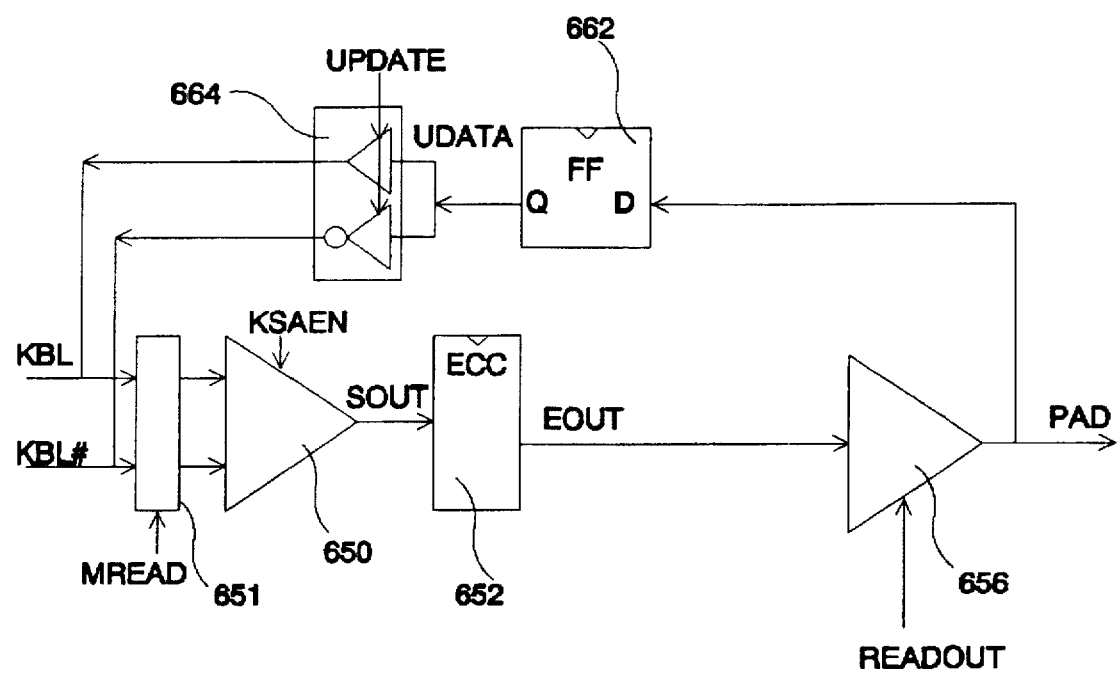
FIG. 6 is a schematic diagram of the IO circuits of the present invention.

FIG. 6 is a block diagram of the IO unit 470 in FIG. 4b. The bank level bit line pair KBL and KBL# are connected to a bank level sense amplifier 650 through a bank level bit line switch 651. This sense amplifier 650 is identical to the sense amplifier in FIG. 5; its enable signal is KSAEN. The KBL switch 651 is rendered conductive when its enable signal MREAD is active, and it isolates the bit lines from the sense amplifier when MREAD is not active. This bit line switch 651 is used to improve the speed of the sense amplifier as well known to the art of memory design. The output of the sense amplifier, SOUT, is connected to an Error-Correction-Code (ECC) circuit 652. The ECC circuit is well known to the art, so we do not discuss it in further details. The output of the ECC circuit, EOUT, is connected to the input of an output driver 665. The output driver 665 drives the data to external pad when it is enabled by the signal READOUT. For a write operation, we place the data on the pad into a storage register 662. The output of the storage register, UDATA, is connected to a memory write driver 664. The memory write driver 664 is controlled by the UPDATE signal to drive data on KBL and KBL# during a memory update operation.

According to FIG. 4b and FIG. 6, a memory array unit 300 is disclosed. The memory array unit 300 further includes a memory array input/output controller, i.e., I/O unit 470, which includes a temporary storage means, e.g., register 662, for temporarily storing data contents of a latest memory output processed by the input/output controller. The input/output controller further includes an updating means (??? Which element is this in FIG. 6 or other FIGS.???) for managing an update of the temporary storage means 662 by storing an updated data therein. The memory array input/output controller 470 being connected to the cell-refreshing sense-amplifiers provided for terminating a memory read operation before a cell-refreshing operation is completed (please refer to FIG. 9 and the description pertaining to FIG. 9 below) with the updated data stored in the temporary storage means 662.

According to FIG. 4b and FIG. 6, the method of organizing the memory cells as disclosed in this invention further includes the steps of: (e) connecting a memory array input/output controller to the cell-refreshing sense amplifiers; (f) temporarily storing data contents of a latest memory output in the memory array input/output controller; (g) managing an update of the temporary storage means by storing an updated data therein; and (h) terminating a memory read operation before completing a cell-refreshing operation (please refer to FIG. 9 and the description pertaining to FIG. 9 below) provided with the updated data stored in the temporary storage means.

FIGS. 7(a-c) show the waveforms of critical signals for the memory described in previous sections.

FIG. 7a shows the timing of critical signals during a memory operation to read data from memory cells (called a "read cycle"). First, the block select signal BLKSEL is activated at time T1. Whenever BLKSEL is active, the precharge circuit of the selected memory block is turned off, so does the precharge circuit of all the sense amplifiers of the selected memory unit. The precharge signals are not shown in waveforms because the information is redundant with respect to BLKSEL signal. After BLKSEL is active, block word line WL is active at time T2. Once WL is active, a minute potential difference starts to develop in block bit line pair BL, BL# as well as unit bit line pair UBL, UBL#. After enough potential difference has developed on the unit bit line pairs, the sense amplifiers of the selected memory unit are activated by activating the enable signal SAEN. The unit sense amplifier starts to magnify the bit line potential once it is activated at T3. The bank level word line KWL is then activated at T4; the potential differences in UBL and UBL# are transferred to bank bit line pairs KBL and KBL# once KWL is activated. Between time T4 and T5, the voltages of UBL and UBL# are drawn toward the precharge voltage PCGV due to charge sharing effect between bank bit lines and unit bit lines; the unit sense amplifier eventually will overcome the charge sharing effect and magnify their potential difference. At time T5, the bank word line KWL is off, and the bank level sense amplifier 750 is activated by KSAEN. The bank level sense amplifier 750 will magnify the potential difference on KBL and KBL# to full power supply voltages. In the mean time, the unit level sense amplifier will also pull UBL and UBL# to full power supply voltage. Because we are relying on the unit level sense amplifier to refresh the selected memory cells, we need to provide a timing margin to make sure the signal charges in those memory cells are fully restored before we can turn off the word line WL at T6. After the word line is off, sense amplifiers are deactivated at T7, then the block select signal BLKSEL is deactivated at T8. Once BLKSEL is off, the memory is set into precharge state, and all bit line voltages return to the precharge voltage PCGV. A memory of this invention has much shorter precharge time than prior art memories due to lower loading on each level of its bit lines. At time T9, all signals are fully restored to their precharge states, and the memory is ready for next memory operation.

FIG. 7b shows the timing of critical signals for a memory operation to refresh the data of memory cells (called a "refresh cycle"). A refresh cycle is very similar to a read cycle except that we do not need to bring the data to bank level. All the bank level signals, KWL, KSAEN, KBL, and KBL# remain inactive throughout a refresh cycle. At time T11, the block select signal BLKSEL is active, then the word line WL is activated at time T12. Potential differences start to develop in block level and unit level bit lines BL, BL#, UBL, and UBL# after WL is activated. At time T13 the sense amplifier is activated. The sense amplifier quickly magnify and drive the bit lines to full power supply voltages. When the charges in selected memory cells are fully restored, we can turn off the word line WL at T14, then turn off block select signal BLKSEL at T15. At time T16, all the signals are restored into precharge states, and the memory is ready for next operation. Comparing FIG. 7b with FIG. 7a, it is obvious that the time need for a fresh cycle is shorter than the time for a read cycle because we do not need to drive KBL and KBL#.

FIG. 7c shows the timing of critical signals during a memory operation to write new data into memory cells (called a "update cycle"). At time T21, the block select signal BLKSEL and bank level word line KWL are activated. In the mean time, the new data is written into the bank level bit lines KBL and KBL#, then propagate into lower level bit lines UBL, UBL#, BL, and BL#. The memory write driver 764 has strong driving capability so that bit lines can be driven to desired values quickly. At time T22, the unit level sense amplifier is activated to assist the write operation. Once the charges in the memory cells are fully updated, the word lines WL and KWL are turned off at T23, then the block select signal BLKSEL are off at T24. At T25 the memory is fully restored to precharge state ready for next memory operation. Comparing FIG. 7c with FIG. 7a, it is obvious that the time needed to execute a write cycle is much shorter than the time needed to execute a read cycle because of the strong driving capability of the memory write driver 764.

As illustrated by FIG. 7a, read cycles are slower than update or refresh cycles because the unit level sense amplifier need to drive both unit level and bank level bit lines so that it takes more time to fully restore the signal charges in the selected memory cells. From the point of view of an external user, the additional time required to refresh the memory does not influence the total latency for a memory read operation because the process to deliver data from bank level circuit to external pad is executed in parallel. The refresh time is therefore "hidden" from external users. The only time an external user can feel the effect of this additional refresh time is when a refresh cycle is scheduled at the same time as a read cycle is requested. The memory can not execute a refresh cycle in parallel to a read cycle at a different address, so one of the requests must wait. External control logic is therefore necessary to handle this resource conflict condition. For a memory with ECC support, data write operations always need to start with memory read operations, so the above problems also apply to memory write operations. In order to be fully compatible with an SRAM, we must make internal memory refresh cycles completely invisible to external users. This is achieved by simple changes in IO circuit shown in FIG. 8, and change in timing control shown in FIG. 9.

Figure 8:
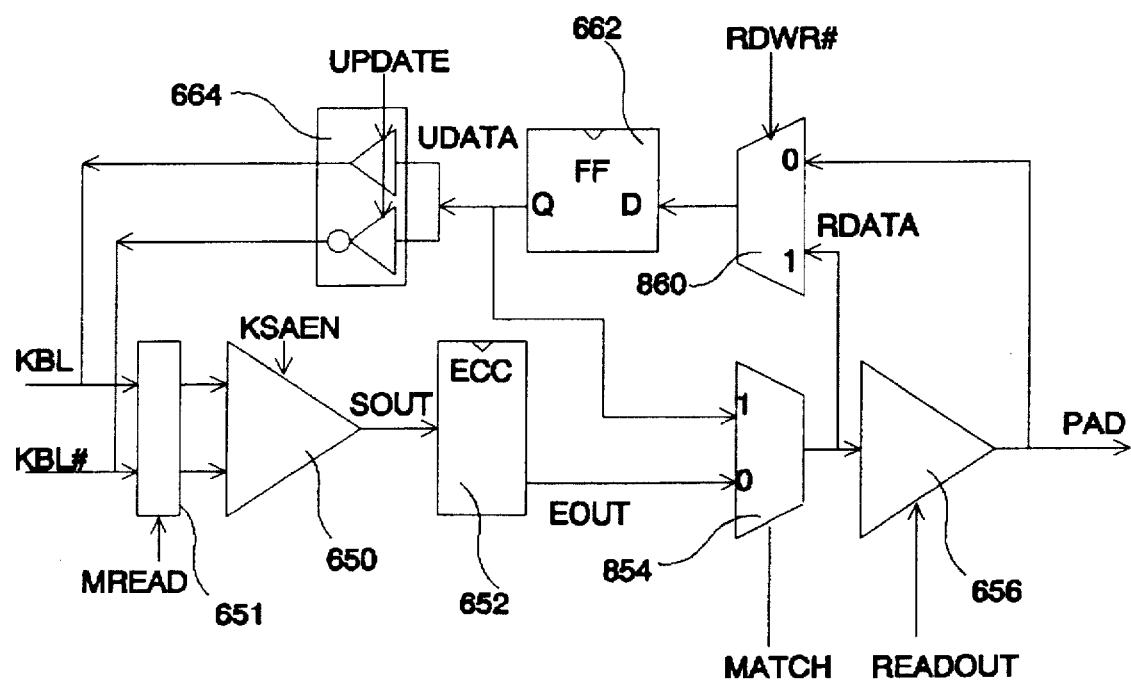
FIG. 8 is a schematic diagram of the IO circuits of the present invention to support faster data read.

The IO circuit in FIG. 8 is almost identical to the IO circuit in FIG. 6 except that it has two additional multiplexers 854, 860. The output of the ECC circuit, EOUT, is connected to the input of a bypass multiplexer 854. During a read cycle, the bypass multiplexer 854 selects the output from the storage register 662 if the reading memory address matches the address of the data stored in the storage register 662. Otherwise, the bypass multiplexer 854 selects the output of the ECC circuit, and send the memory output to the output driver 665. The storage multiplexer 860 selects the input from external pad during a write operation, and it selects the data from memory read out during a read operation. This architecture allows us to "hide" a refresh cycle in parallel with a normal memory operation. It also improves the speed of normal read operations. Using the circuit in FIG. 8, the most updated data of previous memory operation are always stored into the storage register 662. To execute a new memory operation, we always check if the data are stored in the storage register before reading data from the memory array. If the wanted data is already stored in the storage register, no memory operation will be executed, and the data is read from the storage register directly. When a new set of data is read from the memory array, an update cycle is always executed before the end of a new memory operation to write the data currently in the storage buffer back into the memory array. Since we always store every memory read results into the storage registers, there is no need to refresh the selected memory cells immediately. With this configuration, we can terminate the read operation before the unit level sense amplifier can fully refresh the activated memory cells. Therefore, the unit level circuits are available for a refresh cycle at the same time when the memory is propagating the read data to the external pads. This architecture removes the conflict between refresh cycle and normal memory operations. The operation principle of this scheme is further illustrated by the waveforms in FIG. 9.

According to FIG. 4b and FIG. 8, a memory array unit 300 is disclosed. The memory array unit 300 further includes a memory array input/output controller, i.e., I/O unit 470, which includes a temporary storage means, e.g., register 662, for temporarily storing an associated memory address for the data contents stored therein;. The input/output controller further includes an address comparing means, i.e., a multiplexer 860, for comparing a memory access address with the associated memory address stored in the temporary storage means. The input/output controller 470 further includes an output control means, i.e., a multiplexer 854, to provide an output from the temporary storage means when the memory access address matches the associated memory address stored in the temporary data storage means 662 whereby a faster memory access can be achieved with less power consumption.

According to FIG. 4b and FIG. 8, the method of organizing the memory cells as disclosed in this invention further includes the steps of: (j) temporarily storing an associated memory address for the data contents stored in the temporary storage means; (k) comparing a memory access address with the associated memory address stored in the temporary storage means; and (L) providing an output from the temporary storage means when the memory access address matches the associated memory address stored in the temporary data storage means whereby a faster memory access can be achieved with less a power consumption.

FIG. 9 shows the worst case situation when a memory operation overlaps with a refresh operation (to a different address or to the same memory block), and when there is a need to update data from the storage buffer at the same time. Under this worst case condition, the refresh cycle and the memory update cycle must be "hidden" in the memory read operation in order to avoid complexity in system support. On the other word, we must execute the refresh and update cycles in parallel without influencing the timing observable by an external user.

At time Tr1 in FIG. 9, the block select signal BLKSEL is activated for a read operation. At time Tr2, the word line WL is activated, then the unit sense amplifier is activated at Tr3. The unit level word line KWL is activated at Tr4, and the unit level sense amplifier is activated at time Tr5. Until time Tr5, the memory operations and waveforms are identical to those shown in the read cycle in FIG. 8a. The operation is different starting at Tr5; we are allowed to turn off the block select signal BLKSEL, the word lines WL, KWL, and the unit level sense amplifier simultaneously at Tr5 without waiting for full amplification of the memory data. The memory block quickly recovers to precharge state ready for next operation at time Tf1. During this time period, the unit level sense amplifier does not have enough time to fully amplify the signals in the lower level bit lines BL, BL#, UBL, and UBL#. Those activated memory cells no longer stores the original data. That is perfectly all right because the correct data will be stored in the storage register 662 in the following procedures. At time Tf1, the data are sensed by the bank level sense amplifier; the correct data will be remembered in the storage register 662 and updated into those selected memory in the next memory operation, so the data are not lost even when the storage charge in the memory cells are neutralized at this time. At the same time when we are waiting for the bank level circuits to propagate the new read data to external circuits, the unit level and block level memory circuits are available for a refresh operation. This hidden refresh cycle can happen at any memory address. The worst case timing happen when the refresh cycle happens at the same block that we just read. FIG. 9 shows the timing of the worst case condition. At time Tf1, BLKSEL is activated for the refresh cycle. A refresh cycle with identical waveforms as the waveforms in FIG. 8b is executed from time Tf1 to time Tf5. At time Tw1, the memory unit is ready for new operation, and the bank level read operation is completed. At this time, the IO unit 720 is executing ECC correction and the data is propagating to the pads. In the mean time, the bank level resources are available, so we take this chance to update the old data in the storage register 762 back into the memory array by executing a write cycle. The waveforms in FIG. 9 from time Tw1 to Tw5 are identical to the waveforms in FIG. 7c. At the end of the memory operation, the latest data just read from the memory are stored into the storage register 662, the previous data are updated into the memory array, we fulfilled a refresh request, and the external memory operation request is completed.

It is still true that we need to record the data stored in every activated memory cell. Otherwise the data will be lost. The difference between the above memory access procedures and conventional DRAM memory accesses is that the data is temporarily stored in the storage registers so that we do not need to refresh the activated memory cells immediately. This architecture delays data update until next memory process using available bandwidth, so that refresh cycles and update cycles can be hidden to improve system performance.

According to FIGS. 3, 8 and 9, this invention discloses a method for configuring a semiconductor memory device which is provided for operation with a plurality of memory cells each coupled between a bit line and a word line thus constituting a memory array. The method including the steps of: (a) connecting a plurality of cell-refreshing sense amplifiers to the memory cells; (b) connecting a memory array input/output controller to the cell-refreshing sense amplifiers; (c) receiving and executing a data access request by activating a plurality cell-refreshing sense amplifiers for the data access request and temporarily storing data contents of a latest memory output processed by the input/output controller; (d) deactivating the plurality of cell-refreshing sense amplifiers for the data access request and activating a plurality of cell-refreshing sense amplifiers according to a cell refreshing request generated by the input/output controller; and (e) refreshing a plurality of memory cells according to the refreshing request before completing executing the data access request.

In summary, according to FIGS. 3, 8 and 9, this invention also discloses a method for configuring a semiconductor memory device which is provided for operation with a plurality of memory cells each coupled between a bit line and a word line thus constituting a memory array. The method includes the steps of (a) connecting a plurality of cell-refreshing sense amplifiers to the memory cells; (b) connecting a memory array input/output controller to the cell-refreshing sense amplifiers; and (c) generating control signals from the memory array input/output controller to control the cell-refreshing sense amplifiers to refresh a plurality of memory cells in parallel to a data access activity to a plurality of other memory cells.

The above architecture is different from a hybrid memory because (1) this invention speed up DRAM read cycle by terminating the read cycle without waiting for refresh, while the SRAM of the hybrid memory does not simplify the DRAM operation, (2) the system control and device performance of the present invention is the same no matter the memory operation hits the storage register or not, while the performance and control of a cache memory is significantly different when there is a cache miss, (3) the present invention has the same performance when the data is found in the memory array or in the storage register while a hybrid memory has better performance when the data is found in its cache, and (4) the present invention does not introduce significant area penalty while the on-chip SRAM of hybrid memory occupies a significant layout area. The structure and the operation principles of the memory architecture described in the above sections are therefore completely different from the structures and the operation principles of hybrid memories.

As apparent from the foregoing, following advantages may be obtained according to this invention.

(1) The tight pitch layout problem is solved completely. One sense amplifier is shared by many bit line pairs; the layout pitch of peripheral circuits is no longer constrained by the size of the memory cell. Therefore, sense amplifiers and peripheral circuits of high sensitivity with electrical symmetry and high layout efficiency can be realized.

(2) The bit line loading seen by each sense amplifier is reduced dramatically. It is therefore possible to improve the performance significantly.

(3) It is also possible to attach a large number of memory cells to each sense amplifier to reduce total device area.

(5) Changes in memory access procedures allow us to delay the refresh procedure until next memory operation. Internal refresh operations are therefore invisible for external users. The speed for read operation is also improved significantly.

(6) The only devices activated in each memory operation are those devices must be activated. There is little waste in power. The present invention consumes much less power than prior art memories.

A memory device of the present invention is under production. Using 0.6 micron technology to build a memory array containing one million memory cells, we are able to achieve 4 ns access time, which is more than 10 times faster then existing memories devices of the same storage capacity.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What is claimed is:

1. A method for organizing 2M single-bit memory cells into 2N blocks, where M is a multiplication-product of N by I by J, and N, I and J are positive integers, the method comprising steps of:

(a) dividing said 2M single-bit memory cells into N pairs with each pair includes two symmetrical blocks where each of said block includes {J(j)×I} single-bit memory cells, and where j=1, 2, 3, . . . , N, and said positive integer I representing a bit length of a stored data;

(b) arranging said single-bit memory cells in each of said blocks into a J(j)-by-I two dimensional array and by connecting every I single memory cells with a first level bit line in a first bit-line direction and every J(j) single-memory cells by a first level word line wherein each said first level word lines and said first level bit lines intersect at one of said single-bit memory cells;

(c) connecting each of said I first level bit lines in each of said blocks to a corresponding multiple-block first level bit-lines, i.e., multiple-block bit-line-i where i=1, 2, 3, . . . I, wherein said multiple-block first-level bit lines being arranged in a second bit-line direction different from said first-bit line direction and each being connected to a corresponding cell-refreshing sense-amplifier-i where i=1, 2, 3, . . . I; and; (d) applying a block select signal to activate one of said J(j) first level word lines in one of said blocks, i.e., block-n where n is a positive integer ranging from 1 to N, and employing said I cell-refreshing sense amplifiers for detecting memory-cell signals from each of said first level I bit lines of said block n and a corresponding symmetrical block of said block-n, for reading data therefrom whereby said N blocks sharing said I cell-refreshing sense amplifiers.

2. The method of organizing said memory cells of claim 1 further comprising:

connecting a memory array input/output controller to said cell-refreshing sense amplifiers;

temporarily storing data contents of a latest memory output in said memory array input/output controller;

managing an update of said temporary storage means by storing an updated data therein;

terminating a memory read operation before completing a cell-refreshing operation provided with said updated data stored in said temporary storage means.

3. The method of organizing said memory cells of claim 2 further comprising:

temporarily storing an associated memory address for said data contents stored in said temporary storage means;

comparing a memory access address with said associated memory address stored in said temporary storage means; and providing an output from said temporary storage means when said memory access address matches said associated memory address stored in said temporary data storage means whereby a faster memory access can be achieved with less a power consumption.

4. A memory array unit including 2M single-bit memory cells organized into 2N blocks, where M is a multiplication-product of N by I by J, and N, I and J are positive integers, the memory array unit are operated with N cell-refreshing sense amplifiers, said unit comprising:

N pairs of dual-symmetrical blocks where each of said blocks includes {J(j)×I} single-bit memory cells, and where j=1, 2, 3, . . . , N, and said positive integer I representing a bit length of a stored data;

each of said blocks includes a J(j)-by-I two dimensional array and wherein every I single memory cells being connected with a first level bit line along a first bit-line direction and every J(j) single-memory cells are connected by a first level word line wherein each said first level word lines and said first level bit lines intersect at one of said single-bit memory cells;

each of said I first level bit lines in each of said blocks being connected to a corresponding multiple-block first level bit-lines, i.e., multiple-block bit-line-i where i=1, 2, 3, . . . I, wherein said multiple-block first-level bit lines being arranged in a second bit-line direction different from said first-bit line direction and each being connected to said corresponding first level sense-amplifier-i where i=1, 2, 3, . . . I; and;

a block select signal means for activating a block select signal to activate one of said J(j) first level word lines in one of said blocks, i.e., block-n where n is a positive integer ranging from 1 to N, and wherein said I cell-refreshing sense amplifiers being activated for detecting memory-cell signals from each of said first level I bit lines of said block n and a corresponding symmetrical block of said block-n, for reading data therefrom whereby said N blocks sharing said I cell-refreshing sense amplifiers.

5. The memory array unit of claim 4 further comprising:

a memory array input/output controller includes a temporary storage means for temporarily storing data contents of a latest memory output processed by said input/output controller;

said input/output controller further includes an updating means for managing an update of said temporary storage means by storing an updated data therein;

said memory array input/output controller being connected to said cell-refreshing sense-amplifiers provided for terminating a memory read operation before a cell-refreshing operation is completed with said updated data stored in said temporary storage means.

6. The semiconductor memory device of claim 5 wherein:

said temporary storage means further includes a memory for temporarily storing an associated memory address for said data contents stored therein;

said input/output controller further includes an address comparing means for comparing a memory access address with said associated memory address stored in said temporary storage means; and said input/output controller further includes an output control means to provide an output from said temporary storage means when said memory access address matches said associated memory address stored in said temporary data storage means whereby a faster memory access can be achieved with less a power consumption.

7. A semiconductor memory device provided for operation with a plurality of cell-refreshing sense-amplifiers (SAs) comprising:

a memory cell array having a plurality of first-direction first-level bit lines disposed in a parallel manner along a first direction;

said memory cell array further includes a plurality of word lines intersected with said first-direction first-level bit lines;

said memory cell array further includes a plurality of memory cells wherein each of said plurality of memory cells being coupled between one of said first-direction first level bit lines and one of said word lines for storing data therein;

a plurality of different-direction first level bit lines disposed along a plurality of different directions with at least one of said different directions being different from said first direction, wherein each of said first direction first level bit lines connected to one of said cell-refreshing sense amplifiers (SAs) directly or via said different-direction first level bit-lines.

8. The semiconductor memory device of claim 7 wherein:

one of said different directions for arranging said different-direction first level bit lines being perpendicular to said first direction for arranging said first-direction first level bit lines.

9. The semiconductor memory device of claim 7 further comprising:

bit line switches connected between said first level bit lines which are arranged in different directions.

10. The semiconductor memory device of claim 7 further comprising:

a memory array input/output controller includes a temporary storage means for temporarily storing data contents of a latest memory output processed by said input/output controller;

said input/output controller further includes an updating means for managing an update of said temporary storage means by storing an updated data therein;

said memory array input/output controller being connected to said cell-refreshing sense-amplifiers provided for terminating a memory read operation before a cell-refreshing operation is completed with said updated data stored in said temporary storage means.

11. The semiconductor memory device of claim 10 wherein:

said temporary storage means further includes a memory for temporarily storing an associated memory address for said data contents stored therein;

said input/output controller further includes an address comparing means for comparing a memory access address with said associated memory address stored in said temporary storage means; and said input/output controller further includes an output control means to provide an output from said temporary storage means when said memory access address matches said associated memory address stored in said temporary data storage means whereby a faster memory access can be achieved with less a power consumption.

12. A method for configuring a semiconductor memory device for operation with a plurality of cell-refreshing sense-amplifiers (SAs) comprising:

arranging a plurality of first-direction first-level bit lines in a parallel manner along a first direction;

arranging a plurality of word lines for intersecting with said first-direction first-level bit lines;

coupling a memory cell between each of said first-direction first level bit lines and one of said word lines for storing data therein;

arranging a plurality of different-direction first level bit lines along a plurality of different directions with at least one of said different directions being different from said first direction; and connecting each of said first direction first level bit lines to one of said cell-refreshing sense amplifiers (SAs) directly or via said different-direction first level bit-lines.

13. The method of configuration said semiconductor memory device of claim 13 wherein:

configuring one of said different directions for arranging said different-direction first level bit lines to be perpendicular to said first direction for arranging said first-direction first level bit lines.

14. The method of configuring said semiconductor memory device of claim 12 further comprising:

interconnecting bit line switches between said first level bit lines of different directions and said different-direction first level bit lines for selectively switching and activating said bit lines.

15. The method of configuring said semiconductor memory device of claim 12 further comprising:

connecting a memory array input/output controller to said cell-refreshing sense amplifiers;

temporarily storing data contents of a latest memory output in said memory array input/output controller;

managing an update of said temporary storage means by storing an updated data therein;

terminating a memory read operation before a cell-refreshing operation is completed with said updated data stored in said temporary storage means.

16. The method of configuring said semiconductor memory device of claim 15 further comprising:

temporarily storing an associated memory address for said data contents stored in said temporary storage means;

comparing a memory access address with said associated memory address stored in said temporary storage means; and providing an output from said temporary storage means when said memory access address matches said associated memory address stored in said temporary data storage means whereby a faster memory access can be achieved with less a power consumption.

17. A semiconductor memory device provided for operation with a plurality of memory cells each coupled between a bit line and a word line thus constituting a memory array, said memory device comprising:

a plurality of cell-refreshing sense amplifiers connected to said memory cells;

a memory array input/output controller, connected to said cell-refreshing sense amplifiers, includes a temporary storage means for temporarily storing data contents of a latest memory output processed by said input/output controller;

said input/output controller further includes an updating means for managing an update of said temporary storage means by storing an updated data therein provided for terminating a memory read operation before a cell-refreshing operation is completed with said updated data stored in said temporary storage means.

18. The semiconductor memory device of claim 17 wherein:

said temporary storage means further includes a memory for temporarily storing an associated memory address for said data contents stored therein;

said input/output controller further includes an address comparing means for comparing a memory access address with said associated memory address stored in said temporary storage means; and said input/output controller further includes an output control means to provide an output from said temporary storage means when said memory access address matches said associated memory address stored in said temporary data storage means whereby a faster memory access can be achieved with less a power consumption.

19. A method for configuring a semiconductor memory device provided for operation with a plurality of memory cells each coupled between a bit line and a word line thus constituting a memory array, said method comprising:

connecting a plurality of cell-refreshing sense amplifiers to said memory cells;

connecting a memory array input/output controller to said cell-refreshing sense amplifiers;

temporarily storing data contents of a latest memory output processed by said input/output controller;

managing an update of said temporary storage means by storing an updated data therein; and terminating a memory read operation before a cell-refreshing operation is completed with said updated data stored in said temporary storage means.

20. The method of claim 19 further comprising:

temporarily storing an associated memory address for said data contents stored in said temporary storage means;

comparing a memory access address with said associated memory address stored in said temporary storage means; and providing an output from said temporary storage means when said memory access address matches said associated memory address stored in said temporary data storage means whereby a faster memory access can be achieved with less a power consumption.

21. A method for configuring a semiconductor memory device provided for operation with a plurality of memory cells each coupled between a bit line and a word line thus constituting a memory array, said method comprising:

connecting a plurality of cell-refreshing sense amplifiers to said memory cells;

connecting a memory array input/output controller to said cell-refreshing sense amplifiers;

receiving and executing a data access request by activating a plurality cell-refreshing sense amplifiers for said data access request and temporarily storing data contents of a latest memory output processed by said input/output controller;

deactivating said plurality of cell-refreshing sense amplifiers for said data access request and activating a plurality of cell-refreshing sense amplifiers according to a cell refreshing request generated by said input/output controller; and refreshing a plurality of memory cells according to said refreshing request before completing executing said data access request.

* * * * *